United States Patent [19]

Nieh et al.

[11] Patent Number: 5,346,600
[45] Date of Patent: Sep. 13, 1994

[54] PLASMA-ENHANCED MAGNETRON-SPUTTERED DEPOSITION OF MATERIALS

[75] Inventors: Simon K. Nieh, Monrovia; Jesse N. Matossian, Canoga Park; Frans G. Krajenbrink, Newbury Park, all of Calif.

[73] Assignee: Hughes Aircraft Company, Los Angeles, Calif.

[21] Appl. No.: 929,986

[22] Filed: Aug. 14, 1992

[51] Int. Cl.⁵ .................................. C23C 14/35
[52] U.S. Cl. .................... 204/192.3; 204/192.16; 204/298.05; 204/298.06; 204/298.16; 204/298.18; 204/298.26; 427/524; 427/530
[58] Field of Search ........... 204/192.16, 192.3, 298.05, 204/298.06, 298.16, 298.18, 298.26; 427/523, 524, 530

[56] References Cited

U.S. PATENT DOCUMENTS

| | | | |
|---|---|---|---|
| 4,197,175 | 4/1980 | Moll et al. | 204/192.38 |
| 4,990,229 | 2/1991 | Campbell et al. | 204/298.06 |
| 4,992,153 | 2/1991 | Bergmann et al. | 204/192.16 |
| 5,122,252 | 6/1992 | Latz et al. | 204/298.26 |
| 5,196,105 | 3/1993 | Feverstein et al. | 204/298.19 |
| 5,234,560 | 8/1993 | Kadlec et al. | 204/192.12 |

FOREIGN PATENT DOCUMENTS

3503397A1 8/1986 Fed. Rep. of Germany ........................ 204/298.06

OTHER PUBLICATIONS

IBM Technical Disclosure Bulletin, vol. 28, No. 10, Mar. 1986, pp. 4294–4297, "Hollow Cathode–Enhanced RF Sputtering System".
Patent Abstracts of Japan, vol. 8, No. 187 (C-240) (1624) Aug. 28, 1984 & JP-A-59 083 767 (Kawasaki Jukogyo KK) May 15, 1984.
Patent Abstracts of Japan, vol. 8, No. 241 (C-250) (1678) Nov. 6, 1984 & JP-A-59 123 768 (Toyoda Chuo Kenkyusho KK) Jul. 17, 1984.
P. Martin et al., "Ion Assisted Dielectric and Optical Coatings", in *Handbook of Ion Beam Processing Technology: Principles, Deposition, Film Modification and Synthesis*, (1989), pp. 373–414, Noyes Publications, Park Ridge, N.J.
B. Window et al., "Unbalanced DC Magnetrons as Sources of High Ion Fluxes", in *Journal of Vacuum Science and Technology A*, vol. 4, No. 3, pp. 453–457 (May–Jun. 1986).
J. J. Cuomo et al., "Hollow–Cathode–Enhanced Magnetron Sputtering", in *Journal of Vacuum Science and Technology A*, vol. 4, No. 3, pp. 393–396 (May–Jun. 1986).
D. Sanders, "Vacuum Arc–Based Processing", in *Handbook of Plasma Processing Technology: Fundamentals, Etching, Deposition, and Surface Interations*, (1990), pp. 419–446, Noyes Publications, Park Ridge, N.J.

Primary Examiner—Aaron Weisstuch
Attorney, Agent, or Firm—V. D. Duraiswamy; W. K. Denson-Low

[57] ABSTRACT

Plasma-enhanced magnetron-sputtered deposition (PMD) of materials is employed for low-temperature deposition of hard, wear-resistant thin films, such as metal nitrides, metal carbides, and metal carbo-nitrides, onto large, three-dimensional, irregularly shaped objects (20) without the requirement for substrate manipulation. The deposition is done by using metal sputter targets (18) as the source of the metal and immersing the metal sputter targets in a plasma (16) that is random in direction and fills the deposition chamber (12) by diffusion. The plasma is generated from at least two gases, the first gas comprising an inert gas, such as argon, and the second gas comprising a nitrogen source, such a nitrogen, and/or a carbon source, such as methane. Simultaneous with the deposition, the substrate is bombarded with ions from the plasma by biasing the substrate negative with respect to the plasma to maintain the substrate temperature and control the film microstructure. The substrate, metal targets, and plasma are all electrically decoupled from each other and from walls (14) of the deposition chamber (12), so as to provide independent electrical control of each component. The PMD process is applicable not only to the deposition of hard coatings, but also can be applied to any thin film process such as for electrically and thermally conductive coatings and optical coatings, requiring simultaneous, high-flux, ion-bombardment to control film properties.

19 Claims, 4 Drawing Sheets

PLASMA-ENHANCED MAGNETRON-SPUTTERED DEPOSITION OF MATERIALS

CROSS-REFERENCE TO RELATED APPLICATION

The present application is related to application Ser. No. 07/929,970, filed on even date herewith, and entitled "Surface Preparation and Deposition Method for Titanium Nitride onto Carbonaceous Materials".

BACKGROUND OF THE INVENTION

1. Field of the Invention

The present invention relates generally to the deposition of hard coatings onto large-area substrates by ion-assisted sputter deposition, and, more particularly, to improved method and apparatus related to magnetron sputtering deposition with simultaneous high flux ion bombardment of the substrate. Also more particularly, the present invention is directed to the low-temperature ($\leq 450°$ C.), plasma-ion-assisted, high-rate deposition of hard thin films onto large-area, three-dimensional, irregularly shaped objects without the requirement of substrate manipulation.

2. Description of Related Art

To form hard coatings at low substrate temperature, i.e., equal to or less than about 450° C., a thin film method must satisfy several requirements simultaneously. For example, the case of depositing a hard coating of titanium nitride onto a substrate is now considered. The first requirement is that energetic (several eV) atoms, such as titanium, must be delivered to a substrate surface uniformly. The use of an energetic atom aids in improving tile atom mobility on the substrate to nucleate and grow the deposited film at low temperature. Additional requirements are that the substrate surface must be heated uniformly and that the deposited film must be simultaneously subjected to a high-flux ($>1$ mA/cm$^2$) of energetic ($>50$ eV) ion (e.g., argon ion) bombardment sufficient to influence the film microstructure to form a hard coating.

With ion bombardment ($>1$ mA/cm$^2$, $>50$ eV), the hardness of the coating can be increased by a factor of 3 times or more, compared to the hardness of a coating without ion bombardment. For titanium nitride, this corresponds to an increase in the Vickers hardness from 500 Kg/mm$^2$ to 1,500 Kg/mm$^2$ in the presence of ion bombardment.

Sputtering is a technique known to produce energetic (about 5 eV) titanium atoms for deposition of thin films onto surfaces. Thermally evaporated titanium has an energy of about 0.1 to 0.2 eV, which is generally not enough to provide sufficient energy for low temperature film growth. Ionized titanium has an energy of about 50 to 100 eV, which is higher than sputtering. However, for depositing thin films uniformly onto sharp corners, ionized atoms deposit non-uniformly because of the non-uniform electric fields, whereas energetic atoms do not respond to electric fields. Therefore, energetic sputtered atoms are more suitable for uniform deposition at edges, corners, and flat surfaces and at lower temperatures.

For heating of the substrate, electron bombardment or ion bombardment are techniques known to be applicable prior to thin-film deposition. Also, ion beams or plasmas are techniques known to provide fluxes of ions for bombarding substrates during thin-film deposition and which are sufficient for influencing the film microstructure.

A variety of techniques are used to deposit thin films, such as titanium nitride. These include reactive evaporation, arc evaporation, sputter-CVD (chemical vapor deposition), reactive magnetron sputtering, unbalanced magnetron sputtering, and hollow cathode magnetron sputtering.

The leading process using reactive evaporation (RE) is disclosed and claimed in U.S. Pat. No. 4,197,175, "Method and Apparatus for Evaporating Materials in a Vacuum Coating Plant" (called the RE process herein). In this process, electrons are extracted from a separate arc discharge chamber into the process chamber. The electrons are used to ionize the Ar and N$_2$ gas atoms in the process chamber as well as to evaporate titanium metal from a crucible and subsequently ionize the evaporated titanium atoms. The substrate samples are first biased positively to attract electrons from the arc discharge chamber for heating to the substrate. The samples are then biased negatively to attract Ar$^+$ ions which first sputter-clean the substrate surface and then bombard the film during deposition to influence the film microstructure as well as maintain the substrate temperature during the deposition.

There are a number of disadvantages of the foregoing process. The evaporation of titanium and the ion bombardment of the sample cannot be independently controlled since the electron beam is used both for Ar$^+$ and N$_2^+$ plasma production, and for evaporation of titanium atoms from crucible and their subsequent ionization. The titanium is evaporated practically from a point source, which limits the large-scale capability of the process. Complicated sample fixturing and sample manipulation involving rotation of the sample is required. Even with a high degree of ionization of titanium from the evaporator, a high percentage of the titanium deposited onto the surface of the substrate is comprised of neutral titanium atoms. These atoms have the characteristic energy of thermally evaporated atoms: about 0.1 to 0.2 eV. Because of this low energy, a high substrate temperature, about 500°0 C., is required to deposit hard titanium nitride films.

To summarize, in the RE process, film growth is conducted by argon-ion bombardment of the substrate surface simultaneously with the film deposition, sufficient to influence the film microstructure. However, a high percentage ($>30\%$) of the deposited titanium is in the form of non-energetic (0.1 to 0.2 eV) titanium atoms requiring high (500° C.) substrate temperature for hard, thin-film growth. Also, the argon-ion plasma-production process is coupled to the titanium-atom evaporation and ionization process, which does not allow independent control of each process. Furthermore, since titanium atoms are supplied by a point evaporation source, complicated sample manipulation is required and the capability of processing large samples is very limited.

In sputter-CVD, such as disclosed and claimed in U.S. Pat. No. 4,992,153, "Sputter-CVD Process for at Least Partially Coating a Workpiece", a magnetic field-assisted sputtering device is used to generate sputtered atoms which then deposit onto a substrate to grow a hard film in the presence of a separate plasma, which may be argon. The substrate is rotated and the sputter target is held fixed in position. While sputtering is suitable for large-scale deposition, there are several limitations of the sputter-CVD process. Principal among them is the fact that the substrate either electrically floats or is biased positive with respect to the plasma.

When the substrate is allowed to electrically float, ion bombardment from the plasma is insufficient to influence the film microstructure. Any ion bombardment that does occur cannot be controlled without changing the plasma conditions.

When the substrate is biased positive with respect to the plasma, electrons from the plasma bombard the substrate instead of ions. Therefore, in this operating mode, ions do not influence the film microstructure. Instead, electron heating is relied upon for accomplishing this.

Other limitations of the sputter-CVD process include the use of only one sputter target which severely restricts the large-scale processing capability. To process large-scale, three-dimensional, irregularly-shaped substrates, substrate manipulation is required which is cumbersome.

To summarize, in the sputter-CVD process, film growth occurs via energetic (several eV) sputtered titanium atoms; however, there is no simultaneous ion-bombardment of the substrate that is sufficient to influence the film microstructure which is crucial to growing hard, thin films at low substrate temperature. Instead, electron bombardment heating is relied upon to accomplish this. The sputter-CVD process is also restrictive in its capability to process large-scale, three-dimensional objects.

Magnetron sputtering is a process that is well-developed for large-scale deposition of thin films and is described by P. Martin and R. Netterfield, "Ion Assisted Di-electric and Optical Coatings", in *Handbook of Ion Beam Processing Technology: Principles, Deposition, Film Modification and Synthesis*, edited by J. Cuomo et al, Noyes Publications, New Jersey (1989). The sputtered atoms reach the substrate surface with a typical energy of a few eV ($\approx 5$ eV), which makes the deposition temperature of the film between 50° to 100° C. lower compared with the reactive evaporation technique described earlier. However, it is well-known that for low temperature (less than about 450° C.) growth of thin films, high-flux ($>1$ mA/cm$^2$), energetic ($>50$ eV) ion-bombardment is necessary for forming hard, wear-resistant TiN films. Furthermore, in the conventional magnetron sputtering system, the plasma is confined very near the sputtering target. Biasing of the substrate surface does not allow enough ions to be collected from the magnetron plasma to form high quality, hard thin films.

To circumvent this limitation, two techniques have been developed: the unbalanced magnetron, described by B. Window and N. Sawides, "Unbalanced DC Magnetrons as Sources of High Ion Fluxes", *Journal of Vacuum Science and Technology A*, Vol. 4, No. 3, pp. 453–457 (May–June 1986); and the hollow cathode magnetron target, described by J. J. Cuomo and S. M. Rossnagel, "Hollow-Cathode-Enhanced Magnetron Sputtering", *Journal of Vacuum Science and Technology A*, Vol. 4, No. 3, pp. 393–396 (May–June 1986).

In the unbalanced magnetron, the magnetic field at the magnetron target is adjusted and controlled so that the magnetic field lines extend to the substrate surface. This increases the plasma density near the substrate surface to improve the flux rate of ions bombarding the surface. However, use of this process has limitations.

First, the only source of plasma is from the magnetron source itself. Therefore, argon-ion bombardment is coupled to the operation of the magnetron, even though the magnetic field can be varied independently to influence the plasma density. More importantly, the magnetic field configuration of the unbalanced magnetron does not allow for efficient and uniform processing of large-scale substrates that are three-dimensional in shape, or that are magnetic. For example, to treat a cast iron (magnetic material) substrate that is 3-ft×3-ft in size, an extremely strong magnetic field must be generated at the magnetron in order for it to extend over a large distance from the magnetron and envelop the large size of the object. The operation of the unbalanced magnetron is therefore dependent upon the size and shape of the substrate and must be tailored differently for each substrate. Furthermore, since cast iron is magnetic, this will non-uniformly terminate the magnetic field lines, extending from the magnetron, resulting in a non-uniform plasma and subsequent treatment of the substrate by plasma-ion bombardment. In this case, the substrate size, shape, and type (magnetic vs. non-magnetic) will couple to the plasma production process downstream of the magnetron. Finally, electron heating and argon-ion sputter cleaning of the substrate surface cannot be performed because the only source of plasma is from the magnetron, which necessarily produces titanium atoms once a plasma is established.

To summarize, in the unbalanced magnetron process, film growth occurs via energetic (few eV) sputtered titanium atoms and simultaneously with high-flux, energetic ion bombardment from a plasma to influence the film microstructure. However, the plasma production is coupled to the magnetic field extending from the magnetron, not allowing independent control of each parameter. In addition, the process is ill-suited for treatment of large-scale, three-dimensional objects, and for magnetic materials, as well.

In the hollow cathode magnetron technique, some of these limitations are alleviated. The technique is based on the use of a triode discharge in which an auxiliary source of electrons is coupled to the magnetron cathode. The hollow cathode is inserted into the fringe field of a planar magnetron, near the front cathode surface. The hollow cathode is started and biased sufficiently below the plasma potential of the magnetron so that several amperes of electron current can be emitted into the magnetron plasma. These electrons cause additional ionization of the magnetron plasma and allow the operating pressure of the magnetron to be lowered to the high $10^{-5}$ Torr range.

In this pressure range, the magnetron is compatible with the use of a separate broad-beam ion gun of the Kaufman type, which requires operation at relatively low pressures. However, the limitation of this version of the hollow cathode magnetron technique is that three-dimensional, irregularly shaped objects cannot be processed because of the line-of-sight directionality of the ion gun ion beam. In addition, ion current densities in excess of several mA/cm$^2$ required to influence the film microstructure are limited using un-neutralized ion beams because of space-charge effects. Finally, it is important to realize that the hollow cathode enhances only the efficiency of the magnetron. It does not enhance the plasma density near the substrate to aid in ion bombardment of the film during deposition.

To summarize, in the hollow cathode magnetron technique, film growth occurs via energetic (few eV)

sputtered titanium atoms and with simultaneous argon-ion bombardment from a separate ion-beam source to influence the film microstructure. However, the technique is ill-suited to processing of large-scale objects because of the line-of-sight restriction of the ion beam and the limitation to obtain ion current densities of several mA/cm² over large areas.

In arc evaporation, described by D. Sanders, "Vacuum Arc-Based Processing", in *Handbook of Plasma Processing Technology: Fundamentals, Etching, Deposition, and Surface Interactions,* S. M. Rossnagel et al, eds., Noyes Publications, New Jersey (1990), use is made of a Ti plate that is operated at cathode potential. No external plasma is required to produce Ti atoms. Instead, a vacuum cathodic-arc is created between the Ti plate and an anode surface that forms an arc spot on the cathode. The arc spot produces an intense Ti plasma. This arc spot moves around on the Ti plate. Ti atoms, ions, and Ti clusters consisting of macroparticles of Ti atoms are evaporated from the arc spots. When deposited onto the substrate surface, the clusters can make the surface rough and leave weak spots in the coating. In the arc evaporation process, an additional restriction is that high deposition rates are limited. The reason for this is that when the arc-evaporation power increases, the titanium cluster evaporation rate increases, which severely degrades the film quality. This is in contrast to sputtering of titanium, where an increase in sputter power continuously increases the sputter rate of titanium.

Arc evaporation has a high degree of ionization of Ti. However, like the reactive evaporation process, the residual neutral Ti atoms produced during arc-evaporation dominate the film quality, requiring a high substrate temperature compared to magnetron sputtering. For high deposition rates, a low substrate temperature is difficult to maintain because of the additional substrate heating that is generated when energetic (50 to 100 eV) titanium ions deposit onto a substrate.

In arc evaporation, electron heating and $Ar^+$-ion sputter cleaning are not possible because there is no $Ar^+$ ion plasma produced. In addition, sputter cleaning of the substrate surface prior to deposition of the film is not possible because the production of the vacuum arc is coupled to the production of titanium. Once an arc is struck, titanium is produced from the arc and deposited onto the substrate. No argon plasma is produced separately from this arc process.

To summarize, in the arc evaporation technique, film growth is dominated by non-energetic (0.2 eV) thermal titanium atoms despite the production of energetic (ionized) titanium ions from the arc evaporation process. Simultaneous argon-ion bombardment of the substrate to influence film microstructure is absent.

Thus, there remains a need for apparatus and a method for depositing hard, thin films at relatively low temperature and high rate onto large-scale, three-dimensional, irregularly shaped objects without the need for substrate manipulation.

SUMMARY OF THE INVENTION

In accordance with the invention, a novel apparatus and method are provided for depositing metal compounds selected from the group consisting of nitrides, carbides, and carbo-nitrides onto substrates. The apparatus and method are particularly advantageous in depositing hard films of such compounds onto three-dimensional, irregularly shaped, large objects and at low temperatures. The technique, called herein plasma-enhanced magnetron-sputtered deposition, or PMD, is a thin film technique that combines three techniques into one. These techniques are: (1) use of magnetron sputter sources to provide energetic titanium atoms deposited uniformly over a substrate; (2) use of a separate plasma, in which the sputter targets are immersed, to provide the ion bombardment necessary to influence the film microstructure; and (3) use of plasma to provide large-scale, uniform treatment of three-dimensional, irregularly shaped objects.

The apparatus of the invention comprises:
(a) a chamber defined by walls and provided with means for evacuation thereof, means for introducing gases thereinto, and magnetic means for generating a surface magnetic field at the walls of the chamber;
(b) means within the chamber for supporting a substrate on which the metal compound is to be deposited, the means being electrically isolated from the walls of the chamber;
(c) at least one planar magnetron sputter target source comprising the metal component of the metal compound and operatively associated with the substrate, the source being electrically isolated from the walls of the chamber, the source capable of being oriented with respect to the substrate for the production of substantially uniform films;
(d) activation means for turning the target source on and off, the activation means being electrically isolated from the walls of the chamber;
(e) means for creating a plasma from gases, one of the gases comprising an inert gas and at least one other gas including at least one element selected from the group consisting of nitrogen and carbon, the plasma containing positive ions and electrons from the gases, the plasma being random in direction and filling the chamber by diffusion to allow treatment of three-dimensional, irregularly shaped substrates, the means for creating the plasma positioned with respect to the planar magnetron sputter target source so as to immerse the source in the plasma, the means for creating the plasma being electrically isolated from the walls of the chamber, the surface magnetic field minimizing loss of plasma within the chamber; and
(f) means for biasing the substrate either positive or negative with respect to the plasma, the biasing means being electrically isolated from the walls of the chamber.

The method of the invention comprises the steps of:
(a) heating the substrate to a chosen temperature;
(b) depositing the coating of the metal compound onto the surface of the substrate by sputtering the metal from the magnetron sputtering source in the presence of the plasma while maintaining the temperature of said substrate at said chosen temperature; and
(c) simultaneous with the deposition, bombarding the substrate with inert gas ions from the plasma to maintain the substrate temperature and control the deposited film microstructure.

In PMD, at least one magnetron sputter target is used to produce energetic (several eV) metal atoms. While one such target may be employed in the practice of the invention for depositing the metal compound onto small substrates, the use of multiple magnetron sputter targets permits deposition of the metal compound onto large substrates. The ability to orient the sputter target with respect to the substrate aids in achieving uniform deposition of the metal compound onto three-dimensional, irregularly shaped objects. Additionally, the sputter targets are immersed in a dense plasma, which allows substantially uniform ion bombardment of the irregular objects, simultaneous with substantially uniform deposition. The plasma comprises both the inert gas and the reactive gas, such as one capable of generating nitrogen and/or carbon ions. The plasma production process is independent of the sputtered-atom production process. Because of this, the plasma can perform several simultaneous functions. The plasma electrons can assist in improving the efficiency of the magnetron targets. They also can aid in ionizing the sputtered metal atoms. The plasma also provides a high flux ($>>1$ mA/cm$^2$) of ions for bombardment of the deposited film simultaneous with the titanium deposition process. In so doing, thin films can be deposited at low temperature onto three-dimensional, irregularly shaped objects without substrate manipulation. In the PMD process of the invention, the magnetron sputter targets and plasma are isolated (independent and decoupled) from one another to allow independent control or influence in the growth of the thin film.

The plasma in the PMD process of the invention is partially ionized (>10% ion-to-neutral fraction) and random in direction. Once the plasma is generated, it fills the process chamber by diffusion, resulting in a random ion flux that allows three-dimensional, irregularly shaped objects to be enveloped, and the plasma can conform to all of the surface features of the object. The plasma is confined in the process chamber using permanent magnets arranged in rings along the wall of the chamber. By maintaining a high periodicity of the number of magnet rings, the magnetic field is confined to close proximity of the walls of the chamber. The volume of the chamber is therefore devoid of magnetic fields to prevent non-uniform processing of substrates.

The following advantages are obtained by the method and apparatus of the invention:

1. Lower substrate temperature due to the high kinetic energy (few eV) of the deposited metal. That is, hard metal compound films may be deposited at temperatures less than about 450° C.
2. Large-scale processing capability without sample manipulation.
3. High deposition rate of the film. That is, deposition rates on the order of at least 8 μm/hr are readily achieved; this is to be compared to the prior art arc-evaporation, RE, and sputter-CVD processes, which give 2 to 3 μm/hr. It is possible to obtain up to 30 μm/hr by the method of the invention; the only limiting aspect appears to be power to the metal target source and the plasma.

By using an intense plasma that is used simultaneously with, and generated separately from, the sputter sources, the following additional advantages apply:

4. Improved adhesion due to the sputter cleaning of the substrate surface and high flux ion bombardment during the initial deposition.
5. Improved film quality due to the high flux ion bombardment during the deposition.
6. High ion flux rate that is uniform over large areas due to the intense and uniform plasma.
7. Electron heating of the substrate surface.

The PMD process of the invention given above is directed to the deposition of hard wear coatings. However, it may be employed in any thin film process involving the deposition of thin films with simultaneous high flux ion bombardment of the film to influence the film microstructure. Examples include optical coatings and electrically and thermally conductive coatings.

DESCRIPTION OF THE PREFERRED EMBODIMENTS

The plasma-enhanced magnetron-sputtered deposition (PMD) of the invention is a thin film deposition process that eliminates the restrictions of reactive evaporation, arc evaporation, the unbalanced magnetron, and the hollow cathode magnetron deposition processes. PMD allows large-scale deposition of thin films onto three-dimensional, irregularly shaped objects at low temperature. It also does not require sample manipulation.

Figure 1:
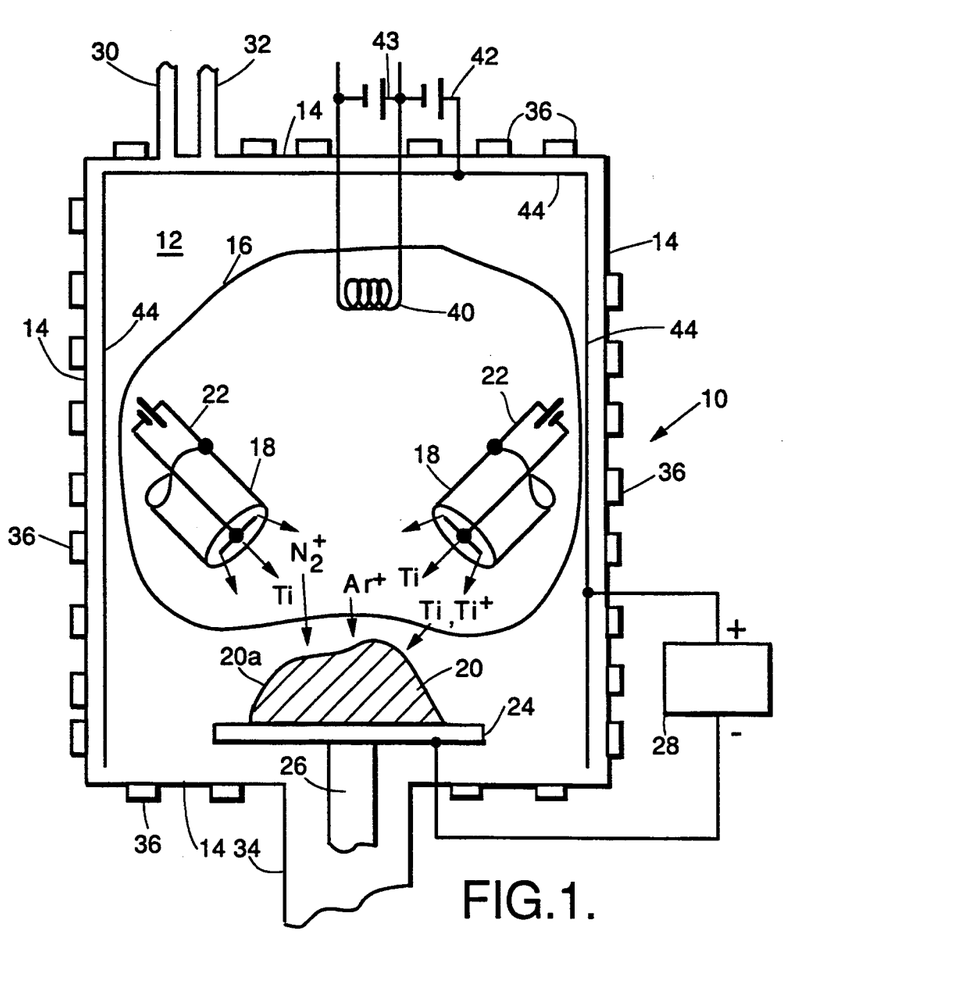
FIG. 1 is a schematic drawing of the apparatus of the invention.

FIG. 1 shows a schematic diagram of the PMD apparatus 10 of the invention, comprising a chamber 12 defined by walls 14, showing the various species generated in a plasma 16 and resulting from sputtering of metal source targets 18. As shown in FIG. 1, use is made of multiple planar magnetron sputter target sources 18 to produce energetic (several eV) metal, here, titanium, atoms. The sputter-targets 18 can be oriented independently, depending on the size and shape of the substrate 20 being coated. For depositing on small substrates 20, one target 18 may be used; however, preferably, multiple targets are employed to obtain uniform coating on large substrates. Use is also made of a plasma 16, rather than an ion-beam source, to allow large-scale, conformal treatment of three-dimensional, irregularly shaped objects 20.

The following description is presented in terms of depositing thin films of titanium nitride onto surfaces 20a of substrates 20. However, the invention is not to be construed as so limited, and may be used to deposit other nitrides, carbides, and carbo-nitrides; examples of other films deposited in accordance with the teachings of the invention include titanium carbo-nitride, titanium-aluminum nitride, silicon nitride, chromium nitride, hafnium nitride, silicon carbide, titanium carbide, and tungsten carbide.

To accomplish the deposition of films of titanium nitride, the magnetron sputter targets 18 are immersed in a plasma 16 consisting of Ar+ and $N_2^+$ ions, and electrons. Operation of the sputter targets 18 is independent of this plasma 16, allowing independent control of the titanium-atom production and deposition onto the substrate 20, argon-ion production and bombardment of the substrate, and electron bombardment of the substrate. The sputter targets 18 are energized by bias means 22, which are controlled by means not shown. Also, the sputter targets 18 are movable, by means not shown, in order to permit orientation of the targets with respect to the substrate 20, as described more fully below.

During sputtering, the titanium targets 18 are biased at a power level ranging from about 400 V and 2.5 A to 1.5 KV and 0.5 A, typically at a voltage of about 600 V and 1.5 A for a 2 inch diameter titanium target. Other metals may require more power, but determination of the appropriate power level may be found in the technical literature.

The substrate 20 is mounted on a substrate support 24, which is isolated from the walls 14 by insulating feedthrough 26, which provides electrical insulation of the substrate from the walls. The substrate 20 can be biased with respect to the plasma by bias means 28 to any polarity and to any voltage, independent of these three processes. In the PMD process of the invention, the sputtered-atom production process can be controlled and optimized to provide high Ti flux rates independent of the plasma-ion bombardment of the substrate 20 that is used to influence the film microstructure.

As indicated above, the position of the sputter targets 18 can be adjusted, this is to provide uniform deposition of titanium over the substrate surface 20a. This is in contrast to the prior art sputter-CVD process, where the sputter target is fixed in position and the substrate is manipulated. For deposition onto large-scale (3-ft×3-ft×0.5-ft), heavy objects (3,000 lbs) such as foundry tools and patterns, it is far easier to manipulate the sputter targets 18 than the substrate 20.

By immersing the sputter targets 18 in the plasma 16, the sputtered titanium may be ionized by the plasma before reaching the substrate surface 20a. This can be used to aid in influencing the relative fraction of sputtered titanium atoms and ionized titanium ions that deposit on the substrate surface 20a. In addition, this influences the energy of deposition of titanium onto the substrate 20, and aids in the uniformity of the deposited titanium as well. Immersion of the sputter targets 18 in the plasma 16 eliminates the restrictions of the prior art hollow-cathode magnetron technique. Namely, a higher ion flux ($>>1$ mA/cm$^2$) for bombarding the substrate is possible from the space-charge-neutralized plasma compared to the un-neutralized pure ion-beam used in conjunction with the hollow cathode magnetron. In addition, the line-of-sight restriction of the ion beam is eliminated, since the plasma 16 can uniformly envelop a three-dimensional irregularly shaped object 20. Simultaneous with these advantages, the presence of the plasma 16 also accomplishes a function of the hollow cathode magnetron technique; i.e., lowering the pressure at which the magnetron targets 18 operate. Finally, the plasma 16 helps improve the efficiency of the sputter targets 18 by providing additional electrons for ionizing argon for sputtering, and the plasma also provides additional argon ions for sputtering the targets. Additionally, in the hollow cathode magnetron, there are restrictions in the location of the hollow cathode with respect to the magnetic field lines emanating from the magnetron to ensure that electrons are injected properly into the magnetron plasma. This requirement is eliminated in the PMD technique of the invention, since neutralized plasma, not just electrons, can diffuse across the magnetic field lines of the magnetron to allow greater efficiency improvement.

The PMD process is flexible and advantageous in the manner in which a thin film can be deposited compared to all other techniques. In the PMD process, the plasma 16 in which the sputter targets 18 are immersed is ON at all times; during substrate heating, thin film deposition, and possibly during phases of substrate cooling. Biasing of the substrate 20 can be accomplished using either DC, for continuous and uniform film deposition, or using pulses for tailored thin film deposition. The use of pulses is also advantageous for thin film deposition onto non-conducting substrates.

The plasma-enhanced magnetron-sputtered deposition apparatus 10 of the invention is a closed system, comprising the chamber 12 defined by walls 14 which surround the plasma 16, the sputter targets 18, and the substrate 20. Inlet means 30 are provided for introducing an inert gas, which forms a component of the plasma 16. Inlet means 32 are also provided for introducing a gas that is used in the production of the deposited film. Outlet means 34 are used to evacuate the chamber 12.

The inert gas employed in the plasma 16 may comprise any of the inert gases, such as argon, neon, and xenon. Preferably, argon is employed in the practice of the invention.

The reactive gas employed in the plasma 16 depends on the metal alloy film to be deposited. For metal nitrides, nitrogen is advantageously employed as the reactive gas. However, other nitrogen-containing gases may also be used, such as $N_2O$ and ammonia. For metal carbides, a carbon-containing gas, such as methane, ethane, benzene, or carbon dioxide, is employed. For metal carbo-nitrides, a mixture of a nitrogen-containing gas and a carbon-containing gas is employed.

The vapor pressure of the inert gas, e.g., argon, ranges from about $5 \times 10^{-4}$ to $5 \times 10^{-3}$ Torr, and typically is about $2 \times 10^{-3}$ Torr. The vapor pressure of the reactive gas, e.g., nitrogen, ranges from about $2 \times 10^{-4}$ to $2 \times 10^{-3}$ Torr, and typically is about $8 \times 10^{-4}$ Torr.

It is important that the plasma 16 that is created be random in ion motion, not directed, so that three-dimensional objects 20 can be uniformly processed and coated. This is accomplished by using a surface-magnetic field configuration, provided by magnets 36, to limit the magnetic field used to confine the plasma 16 within the process chamber 12. By so doing, the volume of the plasma is free of magnetic fields, allowing random ion motion and allowing the plasma 16 to fill the chamber 12 by diffusion instead of directed motion. The magnetic field configuration is accomplished using permanent magnets 36 along the walls 14 of the chamber 12. Consequently, volume magnetic fields do not exist such as those that extend to the substrate 20 as in the prior art unbalanced magnetron process. Therefore, unlike the unbalanced magnetron technology, the PMD process of the invention can treat magnetic materials such as cast iron. Without volume magnetic fields, PMD does not have the plasma non-uniformity problems when treating magnetic materials.

The magnets are in the form of magnet rings 36, which are placed around the perimeter of the walls 14 of the vacuum chamber 12 to aid in confining the plasma 16 and in improving the efficiency of operation of the plasma at low pressure.

Figure 2:
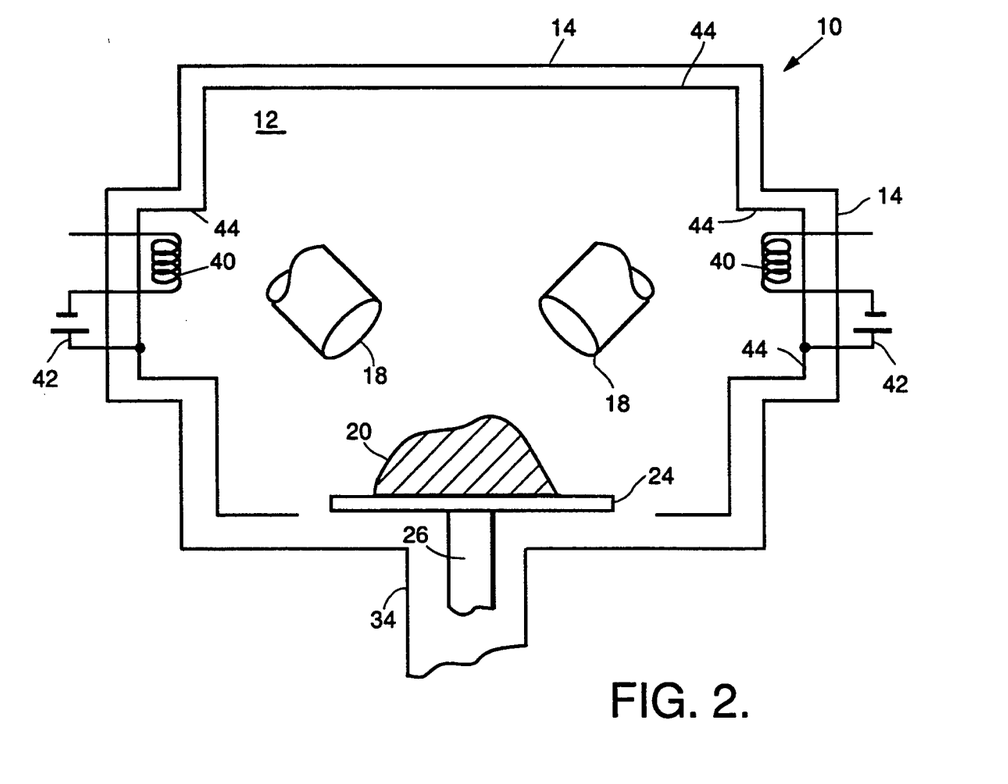
FIG. 2 is a schematic drawing of another embodiment of the apparatus of the invention.

A filament 40 provides electrons for creating the plasma 16. A discharge power supply 42 is used to initiate and sustain the plasma 16 and a filament power supply 43 is used to heat or energize the filament 40. The plasma 16 can be created either by a filament 40 inside the deposition chamber 12, or it can be created by operating a remote plasma source, or sources, with ionization means other than a filament as shown in FIG. 2. The use of remote plasma sources is described in patent applications Ser. No. 07/758,405, filed Aug. 30, 1991, and Ser. No. 07/749,013, filed Aug. 23, 1991, and assigned to the same assignee as the present application.

The filament 40 is operated at a voltage ranging from about 10 to 40 V and at a current ranging from about 15 to 50 A, typically at a voltage of about 20 V and a current of about 30 A. This results in discharge conditions of the plasma 16 at a voltage of about 50 to 200 V and a current of about 5 to 40 A, typically at a voltage of about 100 V and a current of about 30 A.

The orientation and position of the sputter targets 18 may be allowed to be controlled in the apparatus 10. As an example, as shown in FIG. 1, the sputter targets 18 can be oriented to view the substrate 20 and deposit directly onto it. In this orientation, sputtered titanium atoms, and ionized titanium atoms that get created by way of the main plasma 16, are incident onto the substrate 20. In this configuration, the substrate 20 has a mixture of titanium (or metal) atoms and ions deposited onto it. It is important to have control over this type of mixture. By independently varying the density of the plasma 16, more and more ions can be created so that the relative fraction of titanium ions and atoms deposited onto the substrate 20 can be controlled. This is important in controlling film thickness and microstructure when depositing onto sharp edges, corners, and flat surfaces.

Figure 3:
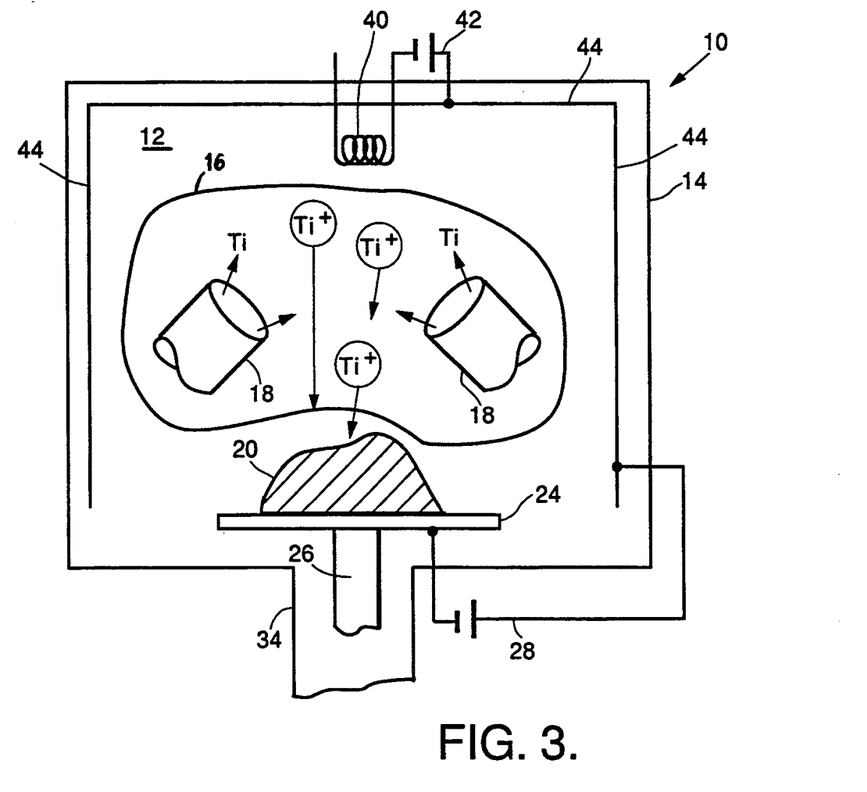
FIG. 3 is a schematic drawing of yet another embodiment of the apparatus of the invention.

In FIG. 3, the sputter targets 18 are oriented so that they cannot view the substrate 20. The targets 18 point upward so that no titanium atoms can be deposited directly onto the substrate 20. In this mode of operation, the sputtered titanium atoms are ionized in the plasma 16 before reaching the vacuum chamber walls 14. Once the titanium is ionized, it can then be influenced by the electric fields of the plasma 16 and drift back randomly toward the substrate 20. In this manner, then, the substrate 20 is provided with a pure titanium ion flux with essentially no neutral atoms, and the sputter targets 18 thus provide the titanium atoms for ionization only. This capability to provide pure titanium ions is important in instances where more control of titanium energy is desired, since a bias placed onto the substrate 20 with respect to the plasma 16 will influence the deposition energy of the titanium ions.

The substrate 20, metal targets 18, and plasma 16 are all electrically decoupled from each other and from the walls 14 of the deposition chamber, so as to provide independent electrical control of each component. The substrate 20 is isolated from the plasma 16 and from the chamber walls 14 by using an insulated feedthrough 26 for supporting the substrate. The plasma 16 is isolated from the vacuum chamber wall 14 by using an anode liner 44 as shown in FIG. 1. This allows the plasma 16 as a whole to be biased positive or negative with respect to the other elements of the system.

PMD deposition typically involves the following steps. First, the substrate 20 is heated and cleaned prior to deposition. In PMD, heating can be accomplished by biasing the substrate 20 positive or negative, with bias means 28, to bombard the substrate surface 20a with either positive ions or electrons from the plasma. During this time, the sputter targets 18 are turned OFF. The ability to choose between ion or electron bombardment is advantageous for heating materials which are sputter-sensitive such as cast iron. Ions cannot be used for heating sputter-sensitive materials; however, electrons can. If the substrate 20 is not sputter-sensitive, then high energy ion bombardment can be used to sputter clean the surface 20a as well as perform surface heating.

The substrate 20 may be biased during electron bombardment to a voltage ranging from about 20 to 100 V and a current ranging from about 5 to 60 A, typically to a voltage of about 40 V and a current of about 20 A. For ion bombardment, the substrate 20 may be biased to a voltage ranging from about 40 to 1,000 V and a current ranging from about 1 A to 10 mA, typically to a voltage of about 100 V and a current of about 1 A.

The substrate 20 is heated to a temperature ranging from about 300° to 500° C., typically about 430° C.

The time of heating, using electron bombardment, ranges from about 10 to 30 minutes, and typically is about 20 minutes. For ion bombardment, the time of heating ranges from about 30 to 60 minutes, and typically is about 40 minutes. These will vary depending on the substrate size using a bombardment power density of 1 to 4 W/cm$^2$.

Cleaning of the substrate 20 may be done by physical sputtering, as described above, or by chemical reaction, such as by use of a separate, hydrogen-ion bombardment with minimal sputtering. For example, this can serve to remove carbonaceous material, e.g., graphite, from high carbon-containing iron, and to remove surface oxides. The hydrogen-ion bombardment process is described in co-pending application Ser. No. 07/929,970, filed concurrently herewith.

Once the heating and/or cleaning is completed, titanium deposition is initiated. The magnetron sputter targets 18 are turned ON, employing means 22, and the substrate 20 is biased negatively to control the Ar$^+$-ion bombardment energy. This is done independent of the operation of the magnetron sputter targets 18 but simultaneous with their operation. In this manner, the PMD process decouples the magnetron plasma production from the substrate ion-bombardment, which is a limitation of the prior art unbalanced magnetron technique.

In the PMD system of the invention, the majority of the titanium flux is in the form of sputtered titanium atoms (about 90%) and the ionized titanium atom flux is about 10%. However, it is possible to tailor this ratio by adjusting the plasma density (the number density of electrons and ions in the plasma) and the power of the operation of the sputter targets 18. While the prior art RE process can also provide adjustment of the ratio of atoms to ions, it should be noted that the RE process is limited to producing non-energetic (0.1 to 0.2 eV) thermal titanium atoms, and cannot produce energetic (few eV) sputtered atoms.

The PMD deposition rate is at least about 1 $\mu$m/hr, with rates of about 8 $\mu$m/hr routinely achievable. Deposition rates on the order of about 30 $\mu$m/hr can be achieved by increasing the size of the sputter target 18. At these rates, the time of deposition depends on the film thickness desired. In general, deposition times range from about 0.5 to 5 hrs, and typically about 1 hr.

The PMD process of the invention has been used to deposit hard, wear-resistant coatings of TiN onto three-dimensional, irregularly shaped objects called blocks, that are used in foundry applications. The blocks variously comprised cast iron, stainless steel 304, and D-2 steel. To date, foundry wear tests have demonstrated that PMD-deposited TiN is superior to both the reactive evaporation and arc-evaporation processes of the prior art in withstanding sand-abrasion wear.

EXAMPLES

Example 1

The process of the invention was successful in reducing the wear of untreated cast iron blocks subjected to sand-abrasion wear in the manufacturing environment of a foundry plant. A total of five cast iron blocks were treated with various processes for comparison with five untreated blocks. One of the blocks was treated in accordance with the process of the invention and used in comparison with four untreated blocks. In the treatment in accordance with the invention, the following steps were done:

(a) the surface of the cast iron substrate was cleaned with hydrogen ions in a hydrogen plasma at a density on the order of $10^{10}$ hydrogen ions/cm$^3$ for 1 hour; the energy of the hydrogen ions was 100 volts (the hydrogen removed the surface graphite in accordance with the process disclosed in co-pending application Ser. No. 07/929,970);

(b) the substrate was then heated to a temperature of about 400° C. with electrons generated from an argon-ion plasma by biasing the substrate positive with respect to the plasma; the energy of the argon plasma was 40 volts; and (c) a titanium nitride film was deposited in the presence of an argon-ion plasma over the course of 1 hour; the energy of the argon ions was 100 volts.

To conduct the sand-abrasion wear experiment, the blocks were mounted onto a crankshaft pattern. A similar crankshaft pattern was used to mount four untreated cast iron blocks for wear comparison.

A total of 4,000 cycles of sand compaction was accumulated by the foundry plant to provide a preliminary evaluation of the wear resistance of the titanium nitride-treated cast iron blocks. At the completion of the 4,000 cycles, the amount of wear of each block (treated and untreated) was determined on the basis of dimensional measurements at various locations of the surface of each block. The coordinate measuring machine (CMM) used to measure the amount of wear at each point had an accuracy of ±1 mil (±0.0025 cm). Therefore, wear measurements of each block could only be made if more than 1 mil of wear was experienced.

Figure 4:
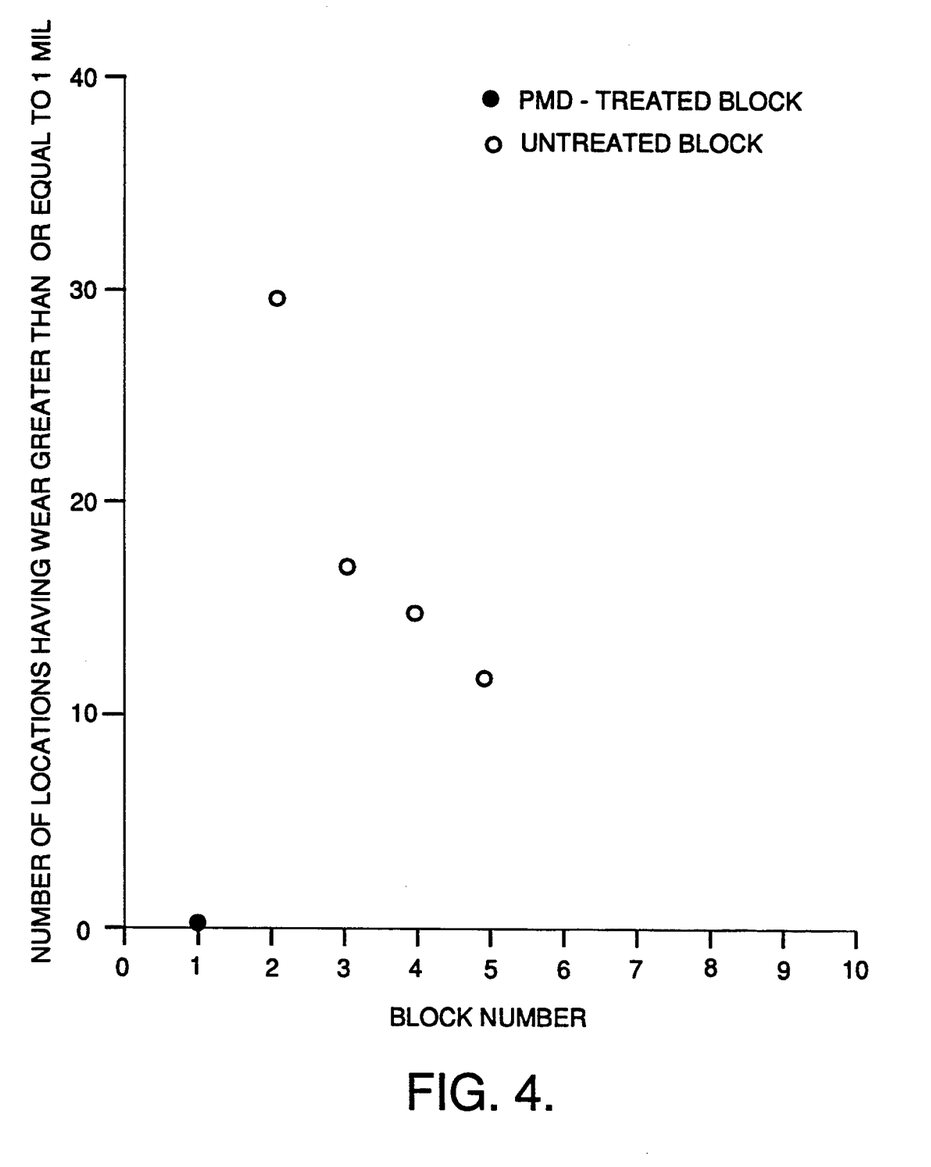
FIG. 4 is a comparative plot of the total number of locations having measurable wear of greater than or equal to 1 mil (0.0025 cm) for cast iron blocks provided with a titanium nitride coating using the surface treatment process of this invention and a special surface treatment technique (removal of graphite) described in related patent application Ser. No. 07/929,970, filed concurrently herewith with and for cast iron blocks devoid of such coating and process.

FIG. 4 compares the total number of locations having measurable wear, that is, wear greater than or equal to 1 mil. For each untreated block, there were between 10 and 30 locations having this measurable wear. For the cast iron block treated in accordance with the invention, there was no measurable wear.

Example 2

Comparison was next made between a cast iron block coated with titanium nitride in accordance with the invention and a cast iron block coated with titanium nitride coated by the process disclosed in U.S. Pat. No. 4,197,175, supra, also called the RE process. For the block coated by the RE process, measurable wear was recorded for 2 locations at the completion of the wear test. This is in contrast to the process of the invention, which resulted in no measurable wear for any location.

In addition to wear determined by dimensional change, color change is an additional indicator. When the gray-colored base metal shows through, this is an indication that the gold-colored titanium nitride coating has been worn through. This type of visual monitor of the wear process was verified during the wear test.

Figure 5:
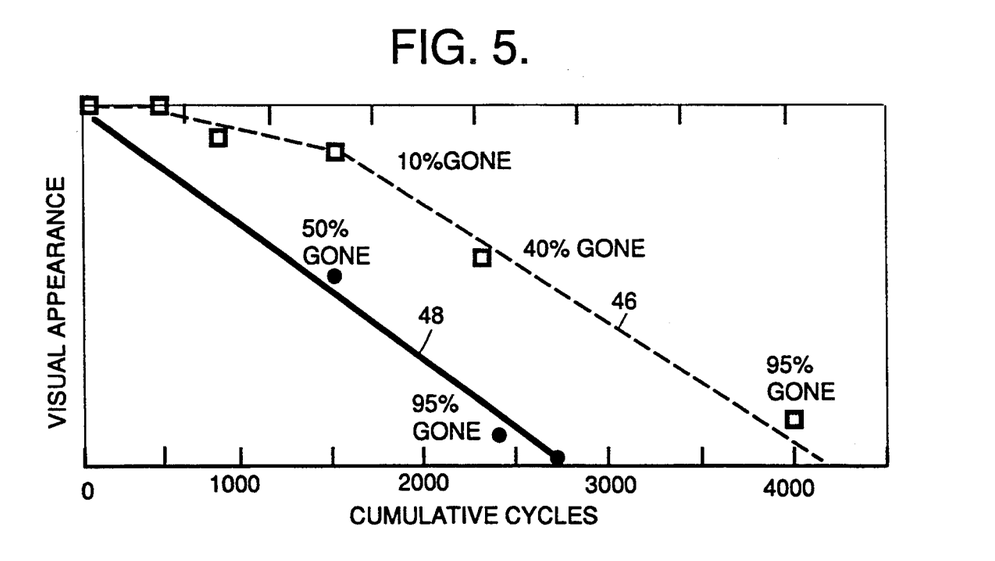
FIG. 5, on coordinates of amount of coating removed and cumulative cycles, is a plot of the amount of wear (removal of titanium nitride coating) as a function of the number of abrasion cycles for cast iron blocks treated in accordance with the invention compared with cast iron blocks treated by the prior art RE process.

FIG. 5 shows a comparison of the wear of cast iron blocks treated in accordance with the invention (Curve 46) and the RE process (Curve 48), based on visual observation of the coating color during the wear test. The top of the graph represents a virgin coating, prior to beginning the wear test. The bottom of the graph represents total removal of the coating.

The data shown in FIG. 5 indicates that the block treated in accordance with the invention was about two times better in wear resistance than the RE process.

Example 3

A coating of 6 μm TiN was deposited onto 304 stainless steel blocks by the process of the invention and by the arc-evaporation process. In the latter case, 100% wear through the coating was observed after 6,490 cycles. In the former case, 100% wear through the coating was observed after 11,229 cycles, indicating that the coating deposited by the process of the invention lasted nearly twice as long.

Example 4

A coating of 6 μm TiN was deposited onto D2 steel blocks. After 15,000 cycles of wear evaluation, no significant wear was observed.

Thus, there has been disclosed a method and apparatus for depositing metal alloys onto the surface of substrates, particularly three-dimensional, irregularly-shaped substrates. Several changes and modifications of an obvious nature may be made, which will be readily apparent to those skilled in this art, and all such changes and modifications are considered to fall within the scope of the invention, as defined by the appended claims.

What is claimed is:

1. Apparatus for depositing a metal compound selected from the group consisting of nitrides and carbides onto a substrate, comprising:

(a) a chamber defined by walls and provided with means for evacuation thereof, means for introducing at least two gases thereinto, and magnetic means for generating a surface magnetic field at said walls of said chamber;

(b) means within said chamber for supporting a substrate on which said metal compound is to be deposited, said means being electrically isolated from said walls of said chamber;

(c) at least one planar magnetron sputter target source comprising the metal component of said metal compound and operatively associated with said substrate, said at least one source electrically isolated from said walls of said chamber, said at least one source capable of being oriented with respect to said substrate;

(d) activation means for turning said at least one target source on and off, said activation means being electrically isolated from said walls of said chamber;

(e) means for creating a plasma from said at least two gases, said at least two gases comprising an inert gas and at least one reactive gas including at least one element selected from the group consisting of nitrogen and carbon, said plasma containing positive ions and electrons from said gases, said plasma filling said chamber by diffusion and being random in direction to allow treatment of three-dimensional, irregularly shaped substrates, said means for creating said plasma positioned with respect to said at least one planar magnetron sputter target source so as to immerse said at least one target source in said plasma, said means for creating said plasma being electrically isolated from said walls of said chamber, said surface magnetic field minimizing loss of said plasma within said chamber;

(f) means for biasing said substrate either positive or negative with respect to said plasma, said biasing means being electrically isolated from said walls of said chamber; and (g) said substrate said at least one target source, and said plasma electrically decoupled from each other so as to enable operation independent from each other.

2. The apparatus of claims 1 wherein said means for biasing said substrate is independently either DC continuous or pulsed.

3. The apparatus of claim 1 further including means for biasing said target source either positive or negative with respect to said substrate.

4. The apparatus of claim 3 wherein said means for biasing said target source are independently either DC continuous or pulsed.

5. The apparatus of claim 1 further including means for biasing said plasma either positive or negative with respect to said substrate.

6. The apparatus of claims 5 wherein said means for biasing said plasma are independently either DC continuous or pulsed.

7. The apparatus of claim 1 further including means for electrically isolating said plasma from said walls of said chamber.

8. The apparatus of claim 1 wherein said inert gas consists essentially of a gas selected from the group consisting of argon, neon, and xenon.

9. The apparatus of claim 1 wherein said plasma is confined within said chamber by permanent magnet rings arranged in periodicity along said walls of said chamber.

10. A process for depositing a hard coating of a metal compound selected from the group consisting of nitrides, carbides, and carbo-nitrides onto a surface of a substrate material, comprising the steps of:

(a) heating said substrate to a chosen temperature;

(b) depositing said coating of said metal compound onto said surface of said substrate by sputtering a metal from a magnetron sputtering source in the presence of a plasma comprising an inert gas and at least one reactive gas containing an element selected from the group consisting of nitrogen and carbon, said magnetron sputtering source operated independently and electrically decoupled from said plasma and from said substrate; and (c) simultaneous with said deposition, bombarding said substrate with inert gas ions from said independently controlled and decoupled plasma to maintain said temperature of said substrate and to control the microstructure of said coating.

11. The process of claim 10 wherein said heating is accomplished by biasing said substrate negative with respect to said plasma to bombard said substrate with positive ions from said plasma.

12. The process of claim 11 wherein said positive ions also clean the surface of said substrate by sputtering.

13. The process of claim 10 wherein said heating is accomplished by biasing said substrate positive with respect to the plasma to bombard said substrate with electrons from said plasma.

14. The process of claim 10 wherein said metal nitride is selected from the group consisting of titanium nitride, titanium-aluminum nitride, chromium nitride, and hafnium nitride.

15. The process of claim 10 wherein said metal carbide is selected from the group consisting of titanium carbide, silicon carbide, and tungsten carbide.

16. The process of claim 10 wherein said metal carbonitride consists essentially of titanium carbo-nitride.

17. The process of claim 10 wherein said inert gas of said plasma is selected from the group consisting of argon, neon, and xenon.

18. The process of claim 10 wherein said metal compound is a metal nitride and said at least one reactive gas is selected from the group consisting of nitrogen, $N_2O$, and ammonia.

19. The process of claim 10 wherein said metal compound is a metal carbide and said at least one reactive gas is selected from the group consisting of methane, ethane, benzene, and carbon dioxide.

* * * * *